US012756473B2

(12) United States Patent
Lo

(10) Patent No.: US 12,756,473 B2
(45) Date of Patent: Oct. 6, 2026

(54) OPTICAL TRANSCEIVER

(71) Applicant: Lumentum Operations LLC, San Jose, CA (US)

(72) Inventor: Lap Pun Lo, Hong Kong (HK)

(73) Assignee: Lumentum Operations LLC, San Jose, CA (US)

( * ) Notice: Subject to any disclaimer, the term of this patent is extended or adjusted under 35 U.S.C. 154(b) by 260 days.

(21) Appl. No.: 18/591,690

(22) Filed: Feb. 29, 2024

(65) Prior Publication Data

US 2024/0297716 A1 Sep. 5, 2024

Related U.S. Application Data

(60) Provisional application No. 63/449,082, filed on Mar. 1, 2023.

(51) Int. Cl.
*H04B 10/00* (2013.01)
*H03F 3/08* (2006.01)
*H04B 10/40* (2013.01)

(52) U.S. Cl.
CPC ............. *H04B 10/40* (2013.01); *H03F 3/087* (2013.01)

(58) Field of Classification Search
CPC H04B 10/40; H04B 10/0795; H04B 10/2507; H04B 10/60; H04J 14/02; G02B 6/4246; G02B 6/43; G02B 6/4247; G02B 6/4281; G02B 6/4269; G02B 6/2983; G02B 6/287
USPC ....... 398/135, 136, 137, 138, 139, 158, 159, 398/164, 33, 38, 25, 26, 27, 79; 385/88, 385/89, 90, 92, 93
See application file for complete search history.

(56) References Cited

U.S. PATENT DOCUMENTS 7,147,387 B2 * 12/2006 Aronson ............ H04B 10/2581 398/81
7,532,820 B2 * 5/2009 Aronson .......... H04B 10/07951 398/81
7,941,053 B2 * 5/2011 Dallesasse ............. H04B 10/40 398/139
2008/0107423 A1 * 5/2008 Lee ................... H04L 25/03343 398/136
2016/0149643 A1 * 5/2016 Kasai .................. H04J 14/0256 398/79

* cited by examiner

*Primary Examiner* — Hanh Phan
(74) *Attorney, Agent, or Firm* — Harrity & Harrity, LLP

(57) ABSTRACT

An optical transceiver includes a printed circuit board (PCB) with an edge; one or more first components associated with a transmitter functionality of the optical transceiver, the one or more first components including a linear driver component and a processing component; one or more second components associated with a receiver functionality of the optical transceiver, the one or more second components including a linear transimpedance amplifier (TIA) component; electrical contacts arranged at the edge of the PCB; first electrical traces, connected between the one or more first components and the electrical contacts; and second electrical traces, connected between the one or more second components and the electrical contacts. The one or more first components are closer to the electrical contacts than the one or more second components.

19 Claims, 6 Drawing Sheets

OPTICAL TRANSCEIVER

CROSS-REFERENCE TO RELATED APPLICATION

This Patent Applications claims priority to U.S. Patent Application No. 63/449,082, filed on Mar. 1, 2023, and entitled "HYBRID OPTICAL MODULE." The disclosure of the prior Application is considered part of and is incorporated by reference into this Patent Application.

TECHNICAL FIELD

The present disclosure relates generally to an optical transceiver, and to an optical transceiver with reduced power consumption.

BACKGROUND

An optical transceiver is a hardware device that can transmit and receive data. An optical transceiver includes transmitter components to convert electrical signals into light and receiver components to convert light into electrical signals.

SUMMARY

In some implementations, an optical transceiver includes a printed circuit board (PCB) with an edge; one or more first components associated with a transmitter functionality of the optical transceiver, the one or more first components including a linear driver component and a processing component; one or more second components associated with a receiver functionality of the optical transceiver, the one or more second components including a linear transimpedance amplifier (TIA) component; electrical contacts arranged at the edge of the PCB; first electrical traces, connected between the one or more first components and the electrical contacts; and second electrical traces, connected between the one or more second components and the electrical contacts, wherein the one or more first components are closer to the electrical contacts than the one or more second components.

In some implementations, an optical transceiver includes a PCB with an edge, a first surface and a second surface, the first surface opposite the second surface; electrical contacts arranged on the first surface and the second surface at the edge of the PCB; a light emission component associated with a transmitter functionality of the optical transceiver; a linear driver component associated with the transmitter functionality of the optical transceiver; a processing component associated with the transmitter functionality of the optical transceiver, the processing component disposed on the first surface of the PCB; a light reception component associated with a receiver functionality of the optical transceiver, the light reception component disposed on the second surface of the PCB; a linear TIA component associated with the receiver functionality of the optical transceiver, the linear TIA disposed on the second surface of the PCB; first electrical traces routed on the first surface of the PCB and connecting the processing component and the electrical contacts; and second electrical traces routed on the second surface of the PCB and connecting the linear TIA component and the electrical contacts, wherein: the receiver functionality of the optical transceiver is not associated with the processing component.

In some implementations, an optical transceiver includes a PCB with an edge; a light emission component associated with a transmitter functionality of the optical transceiver; an integrated component associated with the transmitter functionality of the optical transceiver that includes a linear driver component and a processing component; a light reception component associated with a receiver functionality of the optical transceiver; a linear TIA component associated with the receiver functionality of the optical transceiver; and electrical contacts arranged at the edge of the PCB, wherein: the integrated component and the linear TIA component are disposed on a surface of the PCB in a side-by-side configuration along a width of the surface of the PCB, and the receiver functionality of the optical transceiver is not associated with the processing component.

DETAILED DESCRIPTION

Figure 1A:
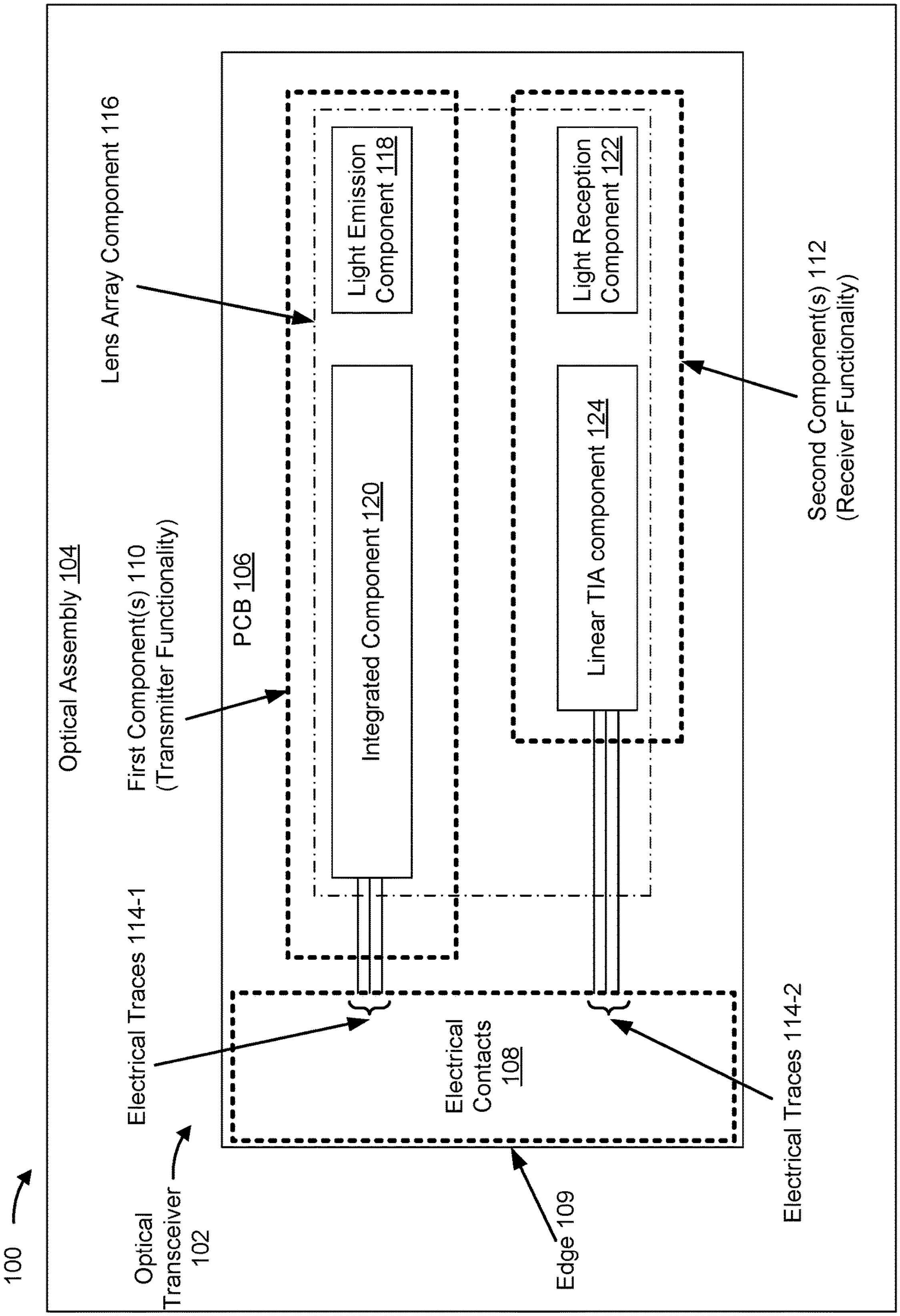
FIGS. 1A-1C are diagrams of an example implementation described herein.

The following detailed description of example implementations refers to the accompanying drawings. The same reference numbers in different drawings may identify the same or similar elements.

An optical transceiver can include processing component, such as a digital signal processor (DSP) or a clock data recovery circuit (CDR), to process electrical signals (e.g., electrical signals that are to be converted to optical signals as part of a transmitter functionality of the optical transceiver, and electrical signals converted from received optical signals as part of a receiver functionality of the optical transceiver). Further, a linear driver is needed to amplify processed electrical signals associated with the transmitter functionality of the optical transceiver, and a TIA is needed to amplify electrical signals associated with the electrical signals associated with the receiver functionality of the optical transceiver. In this way, the optical transceiver ensures consistent communications to and from the optical transceiver. However, utilizing all of these components (e.g., the processing component, the linear driver, and the linear TIA) results in significant power consumption by the optical transceiver.

Some implementations described herein include an optical transceiver that has a reduced power consumption (e.g., as compared to a typical optical transceiver described above). The optical transceiver includes a linear TIA component to enable a receiver functionality of the optical transceiver, but, notably, the optical transceiver does not include a processing component that is associated with the TIA component or with the receive functionality of the optical transceiver. That is, electrical signals associated with the receiver functionality of the optical transceiver are handled by the linear TIA component and not by a DSP or CDR. Accordingly, by not using a processing component associated with the receiver functionality of the optical transceiver, a power consumption of the optical transceiver is reduced. The power consumption of a processing component associated with the transmit functionality and disassociated from the receive functionality can be lower than the complexity of a processing component associated with both the transmit and receive functionality of the same optical transceiver. This is also true for the complexity of such processing components.

Additionally, in some implementations, the optical transceiver may include an integrated component that includes a processing component and a linear driver component to enable a transmitter functionality of the optical transceiver. That is, electrical signals associated with the transmitter functionality of the optical transceiver are handled by the integrated component (as compared to a separate processing component and a separate linear driver component). In this way, the processing component of the integrated component and the power consumption of the integrated component are only associated with the transmitter functionality of the optical transceiver, and therefore an overall power consumption of the optical transceiver is reduced.

Alternatively, in some implementations, the optical transceiver may include a separate processing component and a separate linear driver component to enable the transmitter functionality of the optical transceiver. That is, the electrical signals associated with the transmitter functionality of the optical transceiver are handled by the processing component and the linear driver component while the electrical signals associated with the receiver functionality are not associated with a processing component. In this way, the processing component and its power consumption are only associated with the transmitter functionality of the optical transceiver, and therefore an overall power consumption of the optical transceiver is reduced.

Further, in some implementations, the integrated component, or the processing component (e.g., when no integrated component is present), may be positioned on a PCB of the optical transceiver such as to be closer to electrical contacts of the PCB than the linear TIA component. Accordingly, first electrical traces between the electrical contacts and the integrated component (or the processing component) may be shorter than second electrical traces between the electrical contacts and the linear TIA component, where both the first electrical traces and the second electrical have termination points that connect to the electrical contacts at similar distances from an edge of the PCB. Due to the relative shortness of the first electrical traces, the first electrical traces are less susceptible to channel loss (e.g., electrical signals that propagate via the first electrical traces are less likely to experience attenuation, noise, crosstalk, distortion, and/or other issues) than the second electrical traces.

In this way, the optical transceiver maintains a consistency (e.g., a link bit error rate (BER) consistency) of electrical signals associated with the transmitter functionality of the optical transceiver. This, in turn, allows the optical transceiver to be used with another device, such as a switch with an application specific integrated circuit (ASIC) that is not configured to compensate for transmitter channel loss, where a consistency of transmitter electrical signals is desired (and a relative inconsistency of receiver electrical signals is acceptable).

Accordingly, in at least some cases, the optical transceiver described herein is preferred over a higher power-consuming optical transceiver.

Figure 1B:
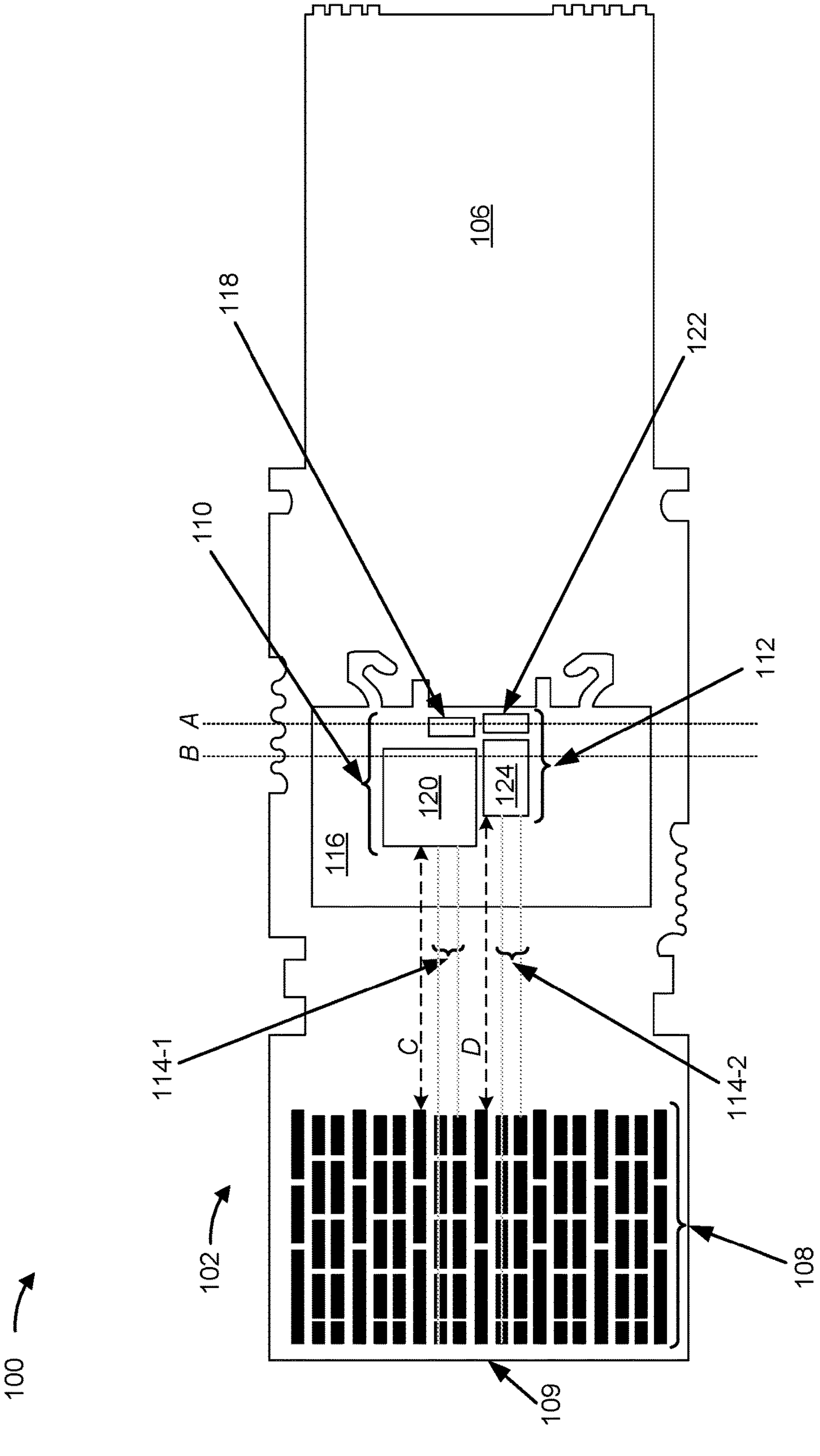
Figure 1C:
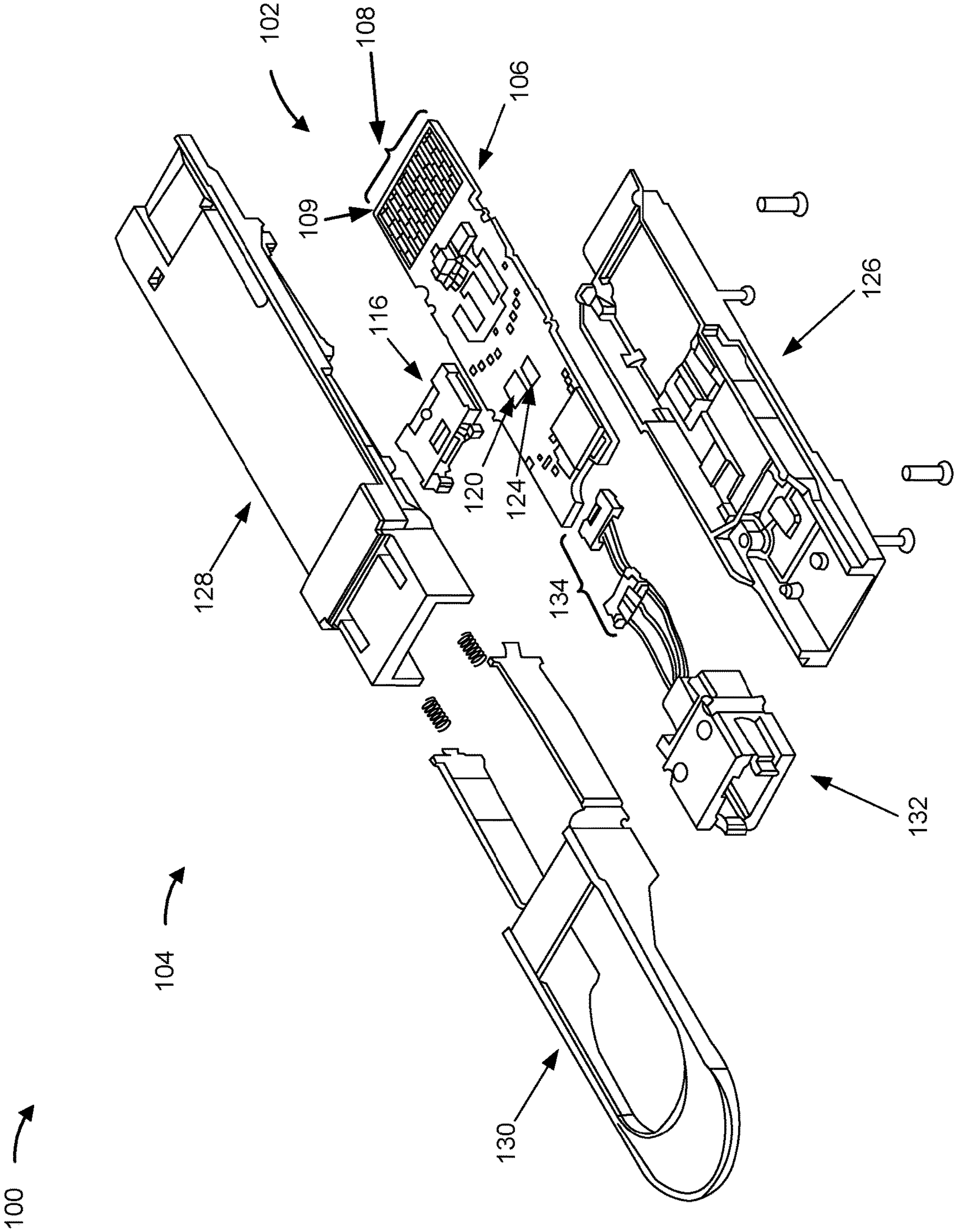

FIGS. 1A-1C are diagrams of an example implementation 100 described herein. As shown in FIGS. 1A-1C, the example implementation 100 may include an optical transceiver 102. The optical transceiver 102 may support a particular data rate, such as a data rate of at least 100 gigabits per second. FIG. 1A shows a schematic view of the optical transceiver 102, FIG. 1B shows a top-down view of a surface of the optical transceiver 102, and FIG. 1C shows an exploded view of an optical assembly 104 that includes the optical transceiver 102.

As shown in FIGS. 1A-1C, the optical transceiver 102 may include a PCB 106, which may have electrical contacts 108 arranged at an edge 109 of the PCB 106; one or more first components 110 associated with a transmitter functionality of the optical transceiver 102; one or more second components 112 associated with a receiver functionality of the optical transceiver 102; a plurality of electrical traces 114 (e.g., that are routed on and/or through one or more surfaces of the PCB 106); and a lens array component 116. The one or more first components 110 may include, for example, a light emission component 118 and an integrated component 120 that includes a linear driver component and a processing component (e.g., the linear driver component and the processing component are formed together into a single component, the integrated component 120). The one or more second components 112 may include a light reception component 122 and a linear TIA component 124.

The PCB 106 may be configured to facilitate mounting and interconnecting components of the optical transceiver 102. The PCB 106 may comprise a non-conductive material, such as a fiber-reinforced plastic material (e.g., a fiberglass-reinforced epoxy resin (FR-4)). The PCB 106 may include the edge 109 (e.g., shown as a left edge in FIGS. 1A-1B), upon which the electrical contacts 108 may be arranged (e.g., for electrically connecting with one or more external components, such as of another device). The electrical contacts 108 may include one or more contacts or pads (e.g., plated with a metal, such as gold) that are arranged in a particular configuration to enable the optical transceiver 102 to connect to another device and to facilitate transmission of electrical signals in and out of the optical transceiver 102.

The light emission component 118, of the one or more first components 110, may be configured to generate light (e.g., an optical signal) for the optical transceiver 102 (e.g., light that is to be emitted by the optical transceiver 102 as part of a transmitter functionality of the optical transceiver 102). The light emission component 118 may be, for example, a light-emitting diode (LED), a laser diode (e.g., a vertical-cavity surface-emitting laser (VCSEL)), or another type of light emission component. The integrated component 120, of the one or more first components 110, may be configured to control the light emission component 118. For example, the linear driver component of the integrated component 120 may be configured to drive the light emission component 118. As a specific example, the linear driver component of the integrated component 120 may amplify electrical signals that are provided by the processing component of the integrated component 120 to the light emission component 118, such as to ensure that optimal light (e.g., in terms of power and signal quality) is generated by the light emission component 118. Further, the processing component of the integrated component 120 may be configured to correct digital data encoded in the electrical signals (e.g., that are provided by another device via the electrical contacts 108 of the PCB 106) and to provide the electrical signals to the light emission component 118 (e.g., via the linear driver component of the integrated component 120). The processing component of the integrated component 120 may include, for example, a DSP and/or a CDR, and may use one or more modulation techniques and/or error correction techniques to correct the digital data encoded in the electrical signals. Together, the light emission component 118 and the integrated component 120 enable the transmitter functionality of the optical transceiver 102.

The light reception component 122, of the one or more second components 112, may be configured to convert incoming light (e.g., an incoming optical signal) into an electrical signal (e.g., an electrical representation of the incoming light). The light reception component 122 may include, for example, a photodiode, a photodetector, or another type of light reception component. The linear TIA component 124 may amplify the electrical signal generated by the light reception component 122 (e.g., by increasing a voltage of the electrical signal). The linear TIA component 124 may provide the electrical signal (e.g., to another device via the electrical contacts 108 of the PCB 106) as part of the receiver functionality of the optical transceiver 102.

Notably, the one or more second components 112 associated with the receiver functionality of the optical transceiver 102 are disassociated from any processing component. For example, no processing component (e.g., not the integrated component 120 that includes the processing component and not any other processing component, such as a DSP or a CDR) is associated with the linear TIA component 124. That is, electrical signals associated with the receiver functionality of the optical transceiver 102 are handled by the linear TIA component 124 and not by a processing component. Accordingly, by not using a processing component associated with the receiver functionality of the optical transceiver 102, a power consumption of the optical transceiver 102 is reduced.

The lens array component 116 may be configured to control transmission and/or reception of light (e.g., optical signals) by the optical transceiver 102. The lens array component 116 may include, for example, one or more lenses (e.g., that comprise glass, plastic, or another material) in a particular arrangement, and may be configured to facilitate aligning and directing of emitted light (e.g., an emitted optical signal) generated by the light emission component 118 (e.g., in association with the transmitter functionality of the optical transceiver 102) and/or to facilitate aligning and/or coupling of incoming light (e.g., an incoming optical signal) into the light reception component 122 (e.g., in association with the receiver functionality of the optical transceiver 102). The lens array component 116 may also be configured to cover (e.g., to serve as a protective case) one or more other components of the optical transceiver 102, as further described herein.

As shown in FIGS. 1A-1C, the light emission component 118, the integrated component 120, the light reception component 122, and the linear TIA component 124 may be disposed on a surface (e.g., the same surface) of the PCB 106. In some implementations, the lens array component 116 may also be disposed on the surface of the PCB 106, and may cover at least one of the light emission component 118, the integrated component 120, the light reception component 122, and the linear TIA component 124. For example, as shown in FIGS. 1A-1C, the light emission component 118, the integrated component 120, the light reception component 122, and the linear TIA component 124 may be covered by the lens array component 116.

As further shown in FIGS. 1A-1C, the light emission component 118 and the light reception component 122 may be disposed on the surface of the PCB 106 in a "side-by-side" configuration (e.g., along a width of the surface of the PCB 106). For example, as a visual aid to understanding the side-by-side configuration, as shown in FIG. 1B, a reference line A (e.g., an imaginary line that is parallel to a "width" rectilinear axis of the PCB 106) may extend through the light emission component 118 and the light reception component 122. Additionally, or alternatively, the integrated component 120 and the linear TIA component 124 may be disposed on the surface of the PCB 106 in a side-by-side configuration (e.g., along a width of the surface of the PCB 106). For example, as a visual aid to understanding the side-by-side configuration, as shown in FIG. 1B, a reference line B (e.g., an imaginary line that is parallel to the width rectilinear axis of the PCB 106) may extend through the integrated component 120 and the linear TIA component 124.

The plurality of electrical traces 114 may interconnect components of the PCB 106, and each electrical trace 214 may run along one or more surfaces and/or within or between layers of the PCB 106. In some implementations, a first set of one or more electrical traces 114-1, of the plurality of electrical traces 114, may connect (e.g., connect between) the one or more first components 110 and the electrical contacts 108 (e.g., a first portion of the electrical contacts 108) of the PCB 106. For example, the first set of one or more electrical traces 114-1 (e.g., as shown in FIGS. 1A-1B by a representative example of the first set of one or more electrical traces 114-1) may connect (e.g., directly connect, such as without running through any other component) the integrated component 120 and the electrical contacts 108 (e.g., the first portion of the electrical contacts 108) of the PCB 106. Further, the first set of one or more electrical traces 114-1 may be routed on the surface of the PCB 106 (e.g., on which the integrated component 120 is disposed) between the integrated component 120 and the electrical contacts 108 of the PCB 106. In this way, electrical signals may be provided (e.g., by another device) from the electrical contacts 108 of the PCB 106 to the integrated component 120 via the first set of one or more electrical traces 114-1, such as to enable the transmitter functionality of the optical transceiver 102.

In some implementations, a second set of one or more electrical traces 114-2, of the plurality of electrical traces 114, may connect between the one or more second components 112 and the electrical contacts 108 (e.g., a second portion of the electrical contacts 108) of the PCB 106. For example, the second set of one or more electrical traces 114-2 (e.g., as shown in FIGS. 1A-1B by a representative example of the second set of one or more electrical traces 114-2) may connect (e.g., directly connect, such as without running through any other component) the linear TIA component 124 and the electrical contacts 108 (e.g., the second portion of the electrical contacts 108) of the PCB 106. Further, the second set of one or more electrical traces 114-2 may be routed on the surface of the PCB 106 (e.g., on which the linear TIA component 124 is disposed) between the linear TIA component 124 and the electrical contacts 108 of the PCB 106. In this way, the linear TIA component 124 may provide an electrical signal (e.g., to another device) via the second set of one or more electrical traces 114-2 and the electrical contacts 108 of the PCB 106, such as to enable the receiver functionality of the optical transceiver 102.

In some implementations, the integrated component 120 (e.g., because the integrated component 120 includes a linear driver component and a processing component) may have a footprint (e.g., on the surface of the PCB 106) such that a side of the integrated component 120 is closer to the electrical contacts 108 of the PCB 106 (e.g., that are arranged at the edge 109 of the PCB 106). For example, as shown in FIG. 1B, a distance C (e.g., along a "length" rectilinear axis of the PCB 106) from the integrated component 120 to the electrical contacts 108 (e.g., a first particular electrical contact 108 that is closest to the integrated component 120) of the PCB 106 may be less than a distance D (e.g., along the length rectilinear axis of the PCB

106) from the linear TIA component 124 to the electrical contacts 108 (e.g., a second particular electrical contact 108 that is closest to the linear TIA component 124) of the PCB 106.

Accordingly, in some implementations, the one or more first components 110 may be closer to the electrical contacts 108 than the one or more second components 112. That is, a particular first component 110 of the one or more first components 110 (e.g., the integrated component 120) that is closest, of the one or more first components 110, to the electrical contacts 108 may be closer to the electrical contacts 108 than a particular second component 112 of the one or more second components 112 (e.g., the linear TIA component 124) that is closest, of the one or more second components 112, to the electrical contacts 108.

Moreover, an electrical trace, of the first set of one or more electrical traces 114-1, with a termination point that connects to the electrical contacts 108 and that is closest to (e.g., as compared to termination points of other electrical traces of the first set of one or more electrical traces 114-1) the edge 109 of the PCB 106 may be shorter than an electrical trace, of the second set of one or more electrical traces 114-2, with a termination point that connects to the electrical contacts 108 and that is closest to (e.g., as compared to termination points of other electrical traces of the second set of one or more electrical traces 114-2) the edge 109 of the PCB 106. For example, as shown in FIG. 1B, the top electrical trace of the first set of one or more electrical traces 114-1 may be shorter than the top electrical trace of the second set of one or more electrical traces 114-2. Additionally, or alternatively, an electrical trace, of the first set of one or more electrical traces 114-1, with a termination point that connects to the electrical contacts 108 and that is farthest from (e.g., as compared to termination points of other electrical traces of the first set of one or more electrical traces 114-1) the edge 109 of the PCB 106 may be shorter than an electrical trace, of the second set of one or more electrical traces 114-2, with a termination point that connects to the electrical contacts 108 and that is farthest from (e.g., as compared to termination points of other electrical traces of the second set of one or more electrical traces 114-2) the edge 109 of the PCB 106. For example, as shown in FIG. 1B, the bottom electrical trace of the first set of one or more electrical traces 114-1 may be shorter than the bottom electrical trace of the second set of one or more electrical traces 114-2.

In this way, due to the shortness of the first set of one or more electrical traces 114-1, the first set of one or more electrical traces 114-1 may be less susceptible to channel loss (e.g., electrical signals that propagate via the first set of one or more electrical traces 114-1 may be less likely to experience attenuation, noise, crosstalk, distortion, and/or other issues) than the second set of one or more electrical traces 114-2.

As shown in FIG. 1C, the optical transceiver 102 may be included in the optical assembly 104. The optical assembly 104 may further include a bottom housing component 126, a top housing component 128, a manual interaction component 130, a multiple fiber push-on/pull-off (MPO) housing 132, and MPO connectors 134.

The optical transceiver 102 may be enclosed by the bottom housing component 126 and the top housing component 128. An opening (e.g., a window) may be formed by the bottom housing component 126 and the top housing component 128 to allow the electrical contacts 108 of the PCB 106 of the optical transceiver 102 to connect to another device. The manual interaction component 130 may be a handle, a lever, or another type of manual interaction component 130 to allow manual manipulation of the optical transceiver 102, which thereby allows the optical transceiver 102 to connect to, or disconnect from, the other device (e.g., via the electrical contacts 108 of the PCB 106 of the optical transceiver 102).

The MPO connectors 134 may connect to the lens array component 116 and the MPO housing 132. Accordingly, the MPO connectors 134 may be configured to enable transmission of light (e.g., optical signals) to and from the optical transceiver 102, such as to enable an optical fiber that interfaces with the MPO housing to 132 to communicate with the optical transceiver 102.

As indicated above, FIGS. 1A-1C are provided as an example. Other examples may differ from what is described with regard to FIGS. 1A-1C.

Figure 2A:
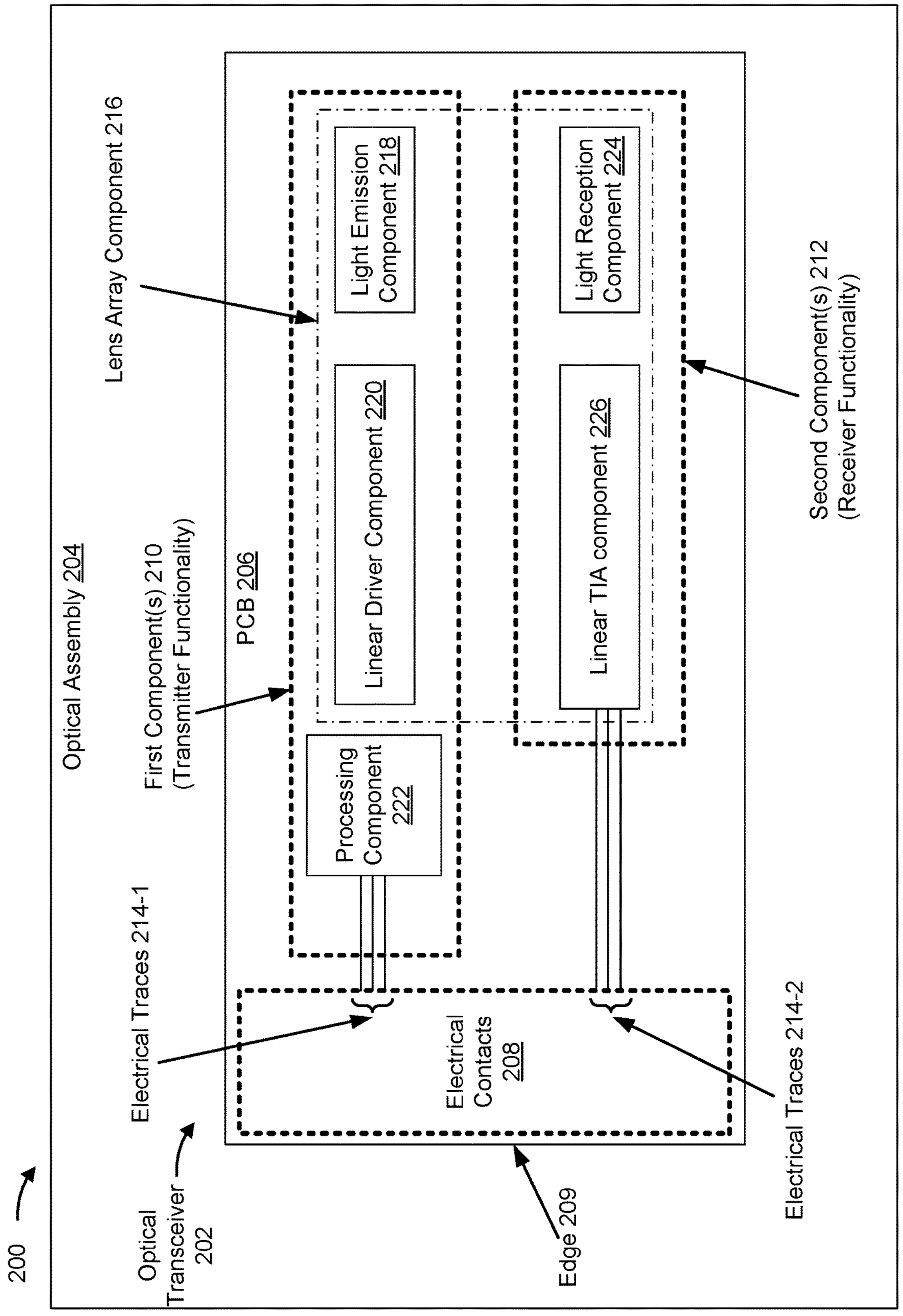
FIGS. 2A-2C are diagrams of an example implementation described herein.
Figure 2B:
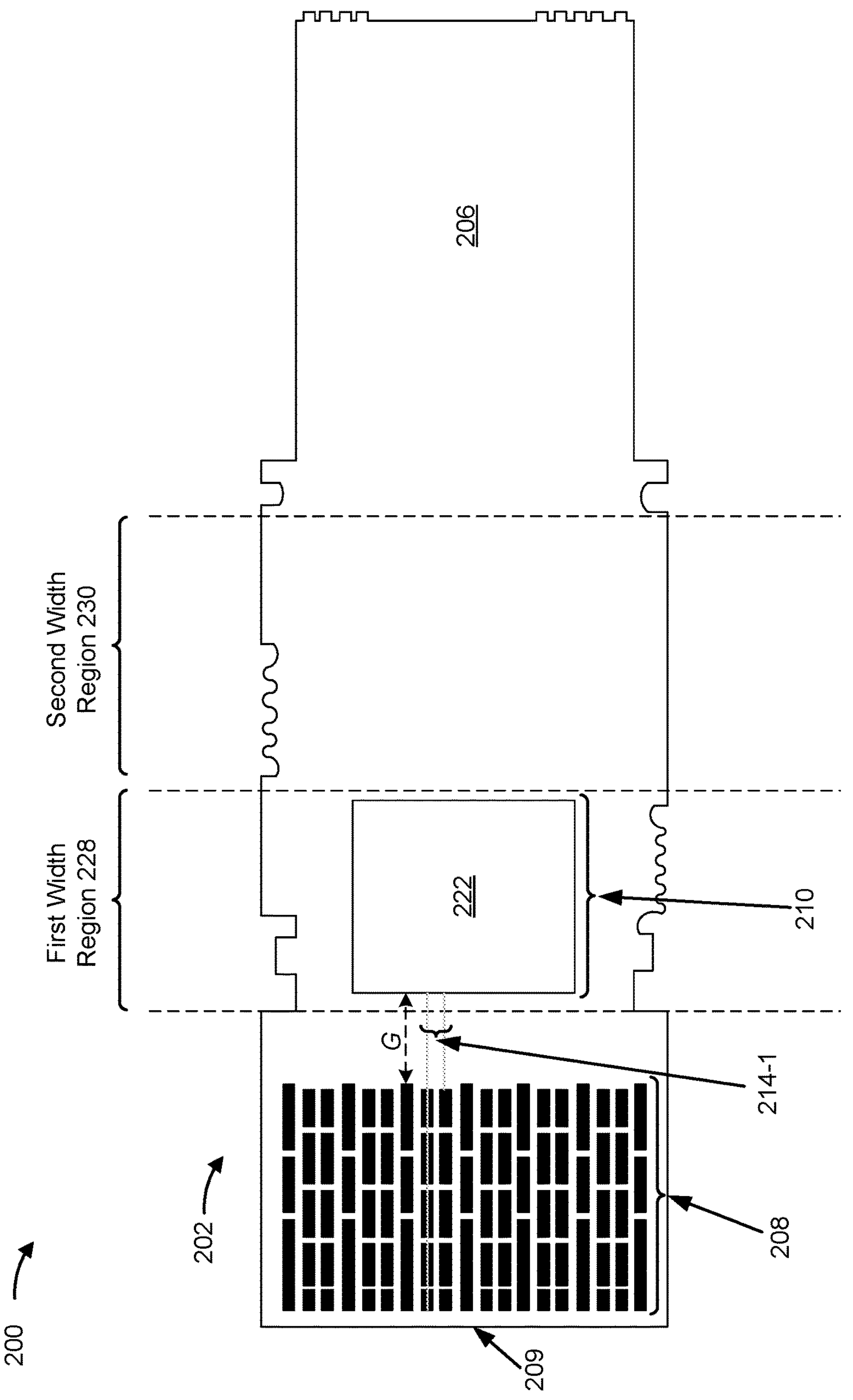
Figure 2C:
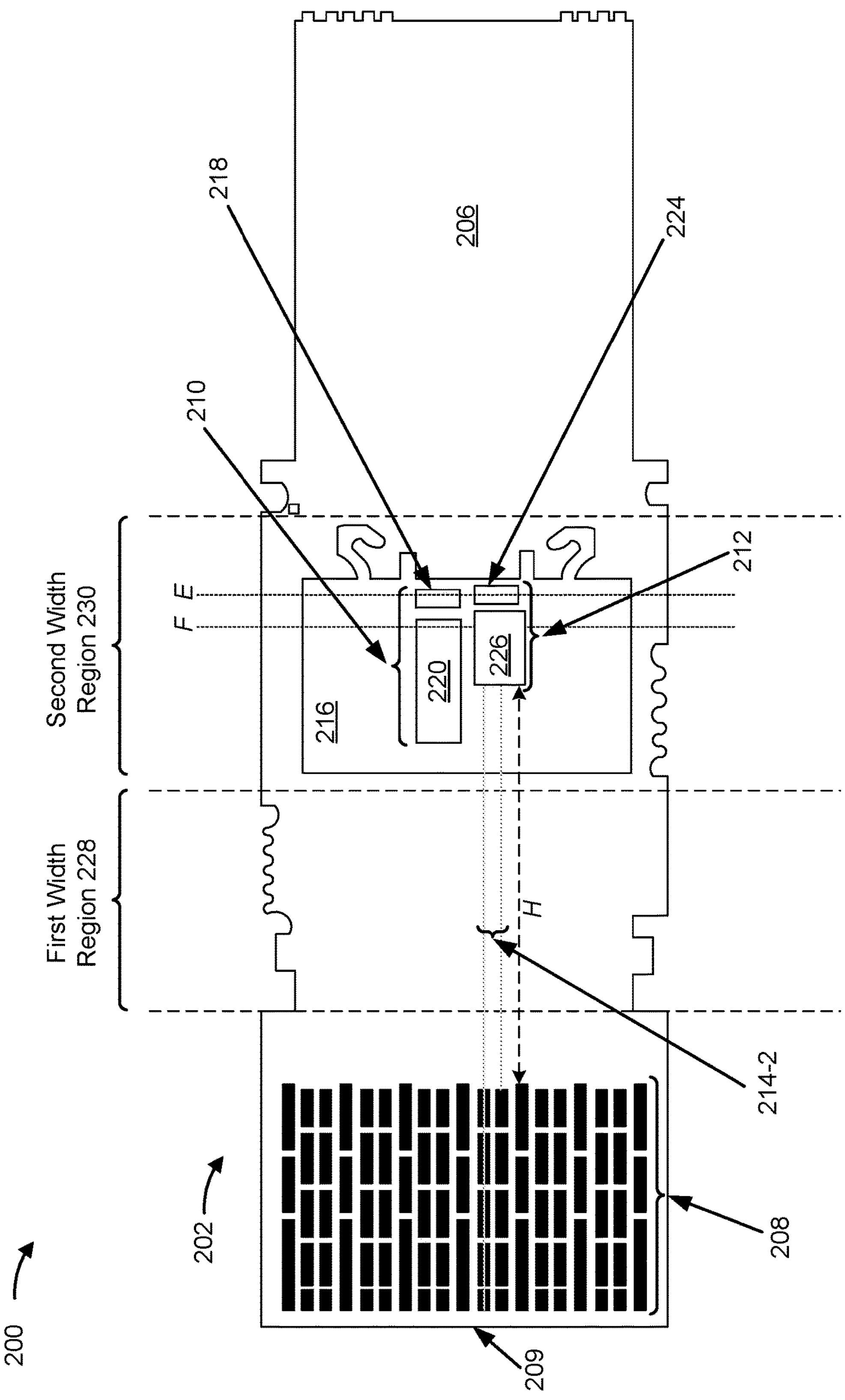

FIGS. 2A-2C are diagrams of an example implementation 200 described herein. As shown in FIGS. 2A-2C, the example implementation 200 may include an optical transceiver 202. The optical transceiver 202 may support a particular data rate, such as a data rate of at least 100 gigabits per second. The optical transceiver may be included in an optical assembly 204 (e.g., that is similar to the optical assembly 104 described herein in relation to FIGS. 1A-1C). FIG. 2A shows a schematic view of the optical transceiver 202, FIG. 2B shows a top-down view of a first surface of the optical transceiver 202, and FIG. 2C shows a top-down view of a second surface (e.g., an opposite surface of the first surface) of the optical transceiver 202.

As shown in FIGS. 2A-2C, the optical transceiver 202 may include a PCB 206, which may have electrical contacts 208 arranged on a first surface and a second surface of the PCB 206 at an edge 209 of the PCB 206; one or more first components 210 associated with a transmitter functionality of the optical transceiver 202; one or more second components 212 associated with a receiver functionality of the optical transceiver 202; a plurality of electrical traces 214 (e.g., that are routed on and/or through one or more surfaces of the PCB 206); and a lens array component 216, which may be configured in a same or similar manner as corresponding components that are described herein in relation to FIGS. 1A-1C.

In some implementations, the one or more first components 210 may include, for example, a light emission component 218, and a linear driver component 220 and a processing component 222 (e.g., instead of an integrated component 120). The light emission component 218 may be configured in a same or similar manner as the light emission component 118 described herein in relation to FIGS. 1A-1C. The linear driver component 220 and the processing component 222 may be configured in a same or similar manner as the linear driver component and the processing component of the integrated component 120, respectively, which are described herein in relation to FIGS. 1A-1C, but may be separate, standalone components (e.g., may not be formed into a single component). The one or more second components 212 may include a light reception component 224 and a linear TIA component 226, which may be configured in a same or similar manner as the light reception component 122 and the linear TIA component 124, described herein.

Notably, the one or more second components 212 associated with the receiver functionality of the optical transceiver 202 are disassociated from any processing component. For example, no processing component (e.g., not the processing component 222 and not any other processing component, such as a DSP or a CDR) is associated with the linear TIA component 226. That is, electrical signals associated with the receiver functionality of the optical transceiver 202 are handled by the linear TIA component 226 and not by a processing component. Accordingly, by not using a processing component associated with the receiver functionality of the optical transceiver 202, a power consumption of the optical transceiver 202 is reduced.

As shown in FIG. 2B, the processing component 222 may be disposed on the first surface of the PCB 206. For example, the processing component 222 may be disposed on the first surface of the optical transceiver 202 in association with a first width region 228 (e.g., that extends across the width of the optical transceiver 202). As shown in FIG. 2C, the light emission component 218, the linear driver component 220, the light reception component 224, and the linear TIA component 226 may be disposed on the second surface (e.g., the same surface) of the PCB 206. For example, the light emission component 218, the linear driver component 220, the light reception component 224, and the linear TIA component 226 may be disposed on the second surface of the optical transceiver 202 in association with a second width region 230 (e.g., that extends across the width of the optical transceiver 202). As shown in FIGS. 2B-2C, the first width region 228 and the second width region 230 may not overlap, and the first width region 228 may be between the second width region 230 and the electrical contacts 208 of the PCB 206 (e.g., the first width region 228 may be closer to the electrical contacts 208 of the PCB 206).

As further shown in FIG. 2C, the lens array component 216 may also be disposed on the second surface of the PCB 106, and may cover at least one of the light emission component 218, the linear driver component 220, the light reception component 224, and the linear TIA component 226. For example, as shown in FIG. 2C, the light emission component 218, the linear driver component 220, the light reception component 224, and the linear TIA component 226 may be covered by the lens array component 216.

As further shown in FIG. 2C, the light emission component 218 and the light reception component 224 may be disposed on the second surface of the PCB 206 in a side-by-side configuration (e.g., along a width of the surface of the PCB 206). For example, as a visual aid to understanding the side-by-side configuration, a reference line E (e.g., an imaginary line that is parallel to a "width" rectilinear axis of the PCB 206) may extend through the light emission component 218 and the light reception component 224. Additionally, or alternatively, the linear driver component 220 and the linear TIA component 226 may be disposed on the second surface of the PCB 206 in a side-by-side configuration (e.g., along a width of the surface of the PCB 206). For example, as a visual aid to understanding the side-by-side configuration, a reference line F (e.g., an imaginary line that is parallel to the width rectilinear axis of the PCB 206) may extend through the linear driver component 220 and the linear TIA component 226.

The plurality of electrical traces 214 may interconnect components of the PCB 106, and each electrical trace 214 may run along one or more surfaces and/or within or between layers of the PCB 106. In some implementations, a first set of one or more electrical traces 214-1, of the plurality of electrical traces 214, may connect (e.g., connect between) the one or more first components 210 and the electrical contacts 208 (e.g., a first portion of the electrical contacts 208) of the PCB 206. For example, the first set of one or more electrical traces 214-1 (e.g., as shown in FIG. 2B by a representative example of the first set of one or more electrical traces 214-1) may connect (e.g., directly connect, such as without running through any other component) the processing component 222 and the electrical contacts 208 (e.g., the first portion of the electrical contacts 208) of the PCB 206. Further, the first set of one or more electrical traces 214-1 may be routed on the first surface of the PCB 206 (e.g., on which the processing component 222 is disposed) between the processing component 222 and the electrical contacts 208 of the PCB 206. In this way, electrical signals may be provided (e.g., by another device) from the electrical contacts 208 of the PCB 206 to the processing component 222 via the first set of one or more electrical traces 214-1, such as to enable the transmitter functionality of the optical transceiver 202.

In some implementations, a second set of one or more electrical traces 214-2, of the plurality of electrical traces 214, may connect (e.g., connect between) the one or more second components 212 and the electrical contacts 208 (e.g., a second portion of the electrical contacts 208) of the PCB 206. For example, the second set of one or more electrical traces 214-2 (e.g., as shown in FIG. 2C by a representative example of the second set of one or more electrical traces 214-2), of the plurality of electrical traces 214, may connect (e.g., directly connect, such as without running through any other component) the linear TIA component 226 and the electrical contacts 208 (e.g., the second portion of the electrical contacts 208) of the PCB 206. Further, the second set of one or more electrical traces 214-2 may be routed on the second surface of the PCB 206 (e.g., on which the linear TIA component 226 is disposed) between the linear TIA component 226 and the electrical contacts 208 of the PCB 206. In this way, the linear TIA component 226 may provide an electrical signal (e.g., to another device) via the second set of one or more electrical traces 214-2 and the electrical contacts 208 of the PCB 206, such as to enable the receiver functionality of the optical transceiver 202.

In some implementations, the processing component 222 (e.g., because the processing component 222 is disposed on the first surface of the optical transceiver 202 in association with the first width region 228) may be closer to the electrical contacts 208 of the PCB 206 (e.g., that are arranged at the edge 209 of the PCB 206). For example, as shown in FIGS. 2B-2C, a distance G (e.g., along a "length" rectilinear axis of the PCB 206) from the processing component 222 to the electrical contacts 208 (e.g., a first particular electrical contact 208 that is closest to the the processing component 222) of the PCB 206 may be less than a distance H (e.g., along the length rectilinear axis of the PCB 106) from the linear TIA component 226 to the electrical contacts 208 (e.g., a second particular electrical contact 208 that is closest to the linear TIA component 226) of the PCB 206.

Accordingly, in some implementations, the one or more first components 210 may be closer to the electrical contacts 208 than the one or more second components 212. That is, a particular first component 210 of the one or more first components 210 (e.g., the processing component 222) that is closest, of the one or more first components 210, to the electrical contacts 208 may be closer to the electrical contacts 208 than a particular second component 212 of the one or more second components 212 (e.g., the linear TIA component 226) that is closest, of the one or more second components 212, to the electrical contacts 208.

Moreover, an electrical trace, of the first set of one or more electrical traces 214-1, with a termination point that connects to the electrical contacts 208 and that is closest to (e.g., as compared to termination points of other electrical traces of the first set of one or more electrical traces 214-1) the edge 209 of the PCB 206 may be shorter than an electrical trace, of the second set of one or more electrical traces 214-2, with a termination point that connects to the electrical contacts 208 and that is closest to (e.g., as compared to termination points of other electrical traces of the second set of one or more electrical traces 214-2) the edge 209 of the PCB 206. For example, as shown in FIGS. 2B-2C, the top electrical trace of the first set of one or more electrical traces 214-1 may be shorter than the top electrical trace of the second set of one or more electrical traces 214-2. Additionally, or alternatively, an electrical trace, of the first set of one or more electrical traces 214-1, with a termination point that connects to the electrical contacts 208 and that is farthest from (e.g., as compared to termination points of other electrical traces of the first set of one or more electrical traces 214-1) the edge 209 of the PCB 206 may be shorter than an electrical trace, of the second set of one or more electrical traces 214-2, with a termination point that connects to the electrical contacts 208 and that is farthest from (e.g., as compared to termination points of other electrical traces of the second set of one or more electrical traces 214-2) the edge 209 of the PCB 206. For example, as shown in FIGS. 2B-2C, the bottom electrical trace of the first set of one or more electrical traces 214-1 may be shorter than the bottom electrical trace of the second set of one or more electrical traces 214-2.

In this way, due to the shortness of the first set of one or more electrical traces 214-1, the first set of one or more electrical traces 214-1 may be less susceptible to channel loss (e.g., electrical signals that propagate via the first set of one or more electrical traces 214-1 may be less likely to experience attenuation, noise, crosstalk, distortion, and/or other issues) than the second set of one or more electrical traces 214-2.

Accordingly, because the first width region 228 may be between the second width region 230 and the electrical contacts 208 of the PCB 206, at least one electrical trace of the second set of one or more electrical traces 214-2 may bypass (e.g., may route around) the processing component 222. For example, the at least one electrical trace may route from the second width region 230 to the electrical contacts 208 and may thereby route through the first width region 228, and may thereby bypass the processing component 222 (e.g., because the processing component is disposed on the first surface of the PCB 106 in association with the first width region 228).

As indicated above, FIGS. 2A-2C are provided as an example. Other examples may differ from what is described with regard to FIGS. 2A-2C.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical transceiver, comprising:
a printed circuit board (PCB) with an edge;
one or more first components associated with a transmitter functionality of the optical transceiver, the one or more first components including a linear driver component and a processing component;
one or more second components associated with a receiver functionality of the optical transceiver, the one or more second components including a linear transimpedance amplifier (TIA) component;
electrical contacts arranged at the edge of the PCB;
first electrical traces, connected between the one or more first components and the electrical contacts; and
second electrical traces, connected between the one or more second components and the electrical contacts,
wherein the one or more first components are closer to the electrical contacts than the one or more second components, and
wherein at least one of the second electrical traces bypasses the processing component.

2. The optical transceiver of claim 1, wherein:
the one or more second components associated with the receiver functionality are disassociated from any processing component.

3. The optical transceiver of claim 1, wherein:
an electrical trace, of the first electrical traces, with a termination point that connects to the electrical contacts and that is closest to the edge of the PCB is shorter than an electrical trace, of the second electrical traces, with a termination point that connects to the electrical contacts and that is closest to the edge of the PCB, and an electrical trace, of the first electrical traces, with a termination point that connects to the electrical contacts and that is farthest from the edge of the PCB is shorter than an electrical trace, of the second electrical traces, with a termination point that connects to the electrical contacts and that is farthest from the edge of the PCB.

4. The optical transceiver of claim 1, wherein:

the processing component is disposed on a first surface of the PCB, and the linear driver component and the linear TIA component are disposed on a second surface of the PCB.

5. The optical transceiver of claim 1, wherein:

the processing component is disposed on a first surface of the PCB in association with a first width region of the PCB, the linear driver component and the linear TIA component are disposed on a second surface of the PCB in association with a second width region of the PCB, and the first width region is between the second width region and the electrical contacts of the PCB.

6. The optical transceiver of claim 1, wherein:

the linear driver component and the linear TIA component are disposed on a surface of the PCB in a side-by-side configuration along a width of the surface of the PCB.

7. The optical transceiver of claim 1, wherein:

the linear driver component and the processing component comprise an integrated component of the one or more first components.

8. The optical transceiver of claim 7, wherein:

the integrated component and the linear TIA component are disposed on a surface of the PCB in a side-by-side configuration along a width of the surface of the PCB.

9. The optical transceiver of claim 7, wherein:

the first electrical traces connect the integrated component and the electrical contacts of the PCB, and the second electrical traces connect the linear TIA component and the electrical contacts of the PCB.

10. The optical transceiver of claim 1, wherein the optical transceiver supports a data rate of at least 100 gigabits per second.

11. An optical transceiver, comprising:

a printed circuit board (PCB) with an edge, a first surface and a second surface, the first surface opposite the second surface;

electrical contacts arranged on the first surface and the second surface at the edge of the PCB;

a light emission component associated with a transmitter functionality of the optical transceiver;

a linear driver component associated with the transmitter functionality of the optical transceiver;

a processing component associated with the transmitter functionality of the optical transceiver, the processing component disposed on the first surface of the PCB;

a light reception component associated with a receiver functionality of the optical transceiver, the light reception component disposed on the second surface of the PCB;

a linear transimpedance amplifier (TIA) component associated with the receiver functionality of the optical transceiver, the linear TIA disposed on the second surface of the PCB;

first electrical traces routed on the first surface of the PCB and connecting the processing component and the electrical contacts; and second electrical traces routed on the second surface of the PCB and connecting the linear TIA component and the electrical contacts, wherein:

the receiver functionality of the optical transceiver is not associated with the processing component.

12. The optical transceiver of claim 11, wherein:

an electrical trace, of the first electrical traces, with a termination point that connects to the electrical contacts and that is closest to the edge of the PCB is shorter than an electrical trace, of the second electrical traces, with a termination point that connects to the electrical contacts and that is closest to the edge of the PCB, and an electrical trace, of the first electrical traces, with a termination point that connects to the electrical contacts and that is farthest from the edge of the PCB is shorter than an electrical trace, of the second electrical traces, with a termination point that connects to the electrical contacts and that is farthest from the edge of the PCB.

13. The optical transceiver of claim 11, wherein:

the processing component is disposed on the first surface of the PCB in association with a first width region of the PCB, the light emission component, the linear driver component, the light reception component, and the linear TIA component are disposed on the second surface of the PCB in association with a second width region of the PCB, and the first width region is between the second width region and the electrical contacts of the PCB.

14. The optical transceiver of claim 11, wherein:

the linear driver component and the linear TIA component are disposed on the second surface of the PCB in a side-by-side configuration along a width of the second surface of the PCB.

15. The optical transceiver of claim 11, wherein:

at least one of the second electrical traces bypasses the processing component.

16. An optical transceiver, comprising:

a printed circuit board (PCB) with an edge;

a light emission component associated with a transmitter functionality of the optical transceiver;

an integrated component associated with the transmitter functionality of the optical transceiver that includes a linear driver component and a processing component;

a light reception component associated with a receiver functionality of the optical transceiver;

a linear transimpedance amplifier (TIA) component associated with the receiver functionality of the optical transceiver;

electrical contacts arranged at the edge of the PCB, wherein:

the integrated component and the linear TIA component are disposed on a surface of the PCB in a side-by-side configuration along a width of the surface of the PCB, and the receiver functionality of the optical transceiver is not associated with the processing component;

first electrical traces directly connect the integrated component and the electrical contacts of the PCB;

second electrical traces directly connect the linear TIA component and the electrical contacts of the PCB;

an electrical trace, of the first electrical traces, with a termination point that connects to the electrical contacts and that is closest to the edge of the PCB is shorter than an electrical trace, of the second electrical traces, with a termination point that connects to the electrical contacts and that is closest to the edge of the PCB, and another electrical trace, of the first electrical traces, with a termination point that connects to the electrical contacts and that is farthest from the edge of the PCB is shorter than an electrical trace, of the second electrical traces, with a termination point that connects to the electrical contacts and that is farthest from the edge of the PCB.

17. The optical transceiver of claim 16, wherein:

the integrated component is closer to the edge of the PCB than the linear TIA component.

18. The optical transceiver of claim 16, wherein:

at least one of the second electrical traces bypasses the processing component.

19. The optical transceiver of claim 16, wherein:

one or more components associated with the receiver functionality are disassociated from the processing component.

* * * * *